US010998127B2

(12) United States Patent
Borgnolutti et al.

(10) Patent No.: US 10,998,127 B2
(45) Date of Patent: May 4, 2021

(54) SUPERCONDUCTING MAGNET APPARATUS AND METHOD FOR MAGNETIZING A SUPERCONDUCTOR BULK MAGNET BY FIELD COOLING THROUGH A FERROMAGNETIC SHIELD

(71) Applicant: Bruker Switzerland AG, Faellanden (CH)

(72) Inventors: Franck Borgnolutti, Duebendorf (CH); Stephen Alfred March, Zurich (CH); Joerg Hinderer, Waldshut-Tiengen (DE); Rainer Pietig, Malsch (DE); Robert Schauwecker, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 16/852,724

(22) Filed: Apr. 20, 2020

(65) Prior Publication Data
US 2020/0335269 A1 Oct. 22, 2020

(30) Foreign Application Priority Data

Apr. 18, 2019 (EP) ..................................... 19170280

(51) Int. Cl.
*H01F 27/36* (2006.01)
*G01R 33/34* (2006.01)
(Continued)

(52) U.S. Cl.
CPC ....... *H01F 27/36* (2013.01); *G01R 33/34023* (2013.01); *G01R 33/4215* (2013.01); *H01F 6/04* (2013.01)

(58) Field of Classification Search
CPC .......... H01F 27/36; H01F 6/04; H01F 27/366; H01F 13/003; H01F 6/00; G01R 33/34023; G01R 33/4215
See application file for complete search history.

(56) References Cited

U.S. PATENT DOCUMENTS

| 5,012,217 A * | 4/1991 | Palkovich .......... G01R 33/3875 324/318 |
| 5,138,207 A * | 8/1992 | Hilal ...................... H02K 55/04 310/216.002 |

(Continued)

FOREIGN PATENT DOCUMENTS

JP H07201560 A 8/1995

OTHER PUBLICATIONS

G. Giunchi et al., "Superconducting Permanent Magnet Made by a Bulk MgB2 Ring," in IEEE Transactions on Applied Superconductivity, vol. 18, No. 2, pp. 1216-1219, Jun. 2008 (Year: 2008).*

(Continued)

*Primary Examiner* — Daniel R Miller
(74) *Attorney, Agent, or Firm* — Edell, Shapiro & Finnan, LLC (57) ABSTRACT

A superconductor magnet apparatus (2) includes a superconductor bulk magnet (9), a cryostat (7) and a ferromagnetic shielding body (11). The bulk magnet has a superconductor bore (10), an axis (z) of rotational symmetry, and a maximum outer diameter $OD_{bm}$ in a plane perpendicular to the z axis. The superconductor bore has a minimum cross-sectional area $S_{bo}$ in a plane perpendicular to the z axis. The cryostat has a room temperature bore (8), the bulk magnet is arranged within the cryostat and the room temperature bore is arranged within the superconductor bore. The shielding body has a shielding bore (12), the bulk magnet is arranged within the shielding bore and the shielding body extends beyond the bulk magnet at each axial end by at least $OD_{bm}/3$. For an average cross-sectional area $S_{fb}$ of the shielding body, $S_{fb} \geq 2.5 * S_{bo}$, and the shielding body is arranged within the cryostat.

18 Claims, 6 Drawing Sheets

(51) Int. Cl.
*G01R 33/421* (2006.01)
*H01F 6/04* (2006.01)

(56) References Cited

U.S. PATENT DOCUMENTS

| | | | | |
|---|---|---|---|---|
| 5,296,812 | A * | 3/1994 | Kitamura | G01R 33/3815 324/319 |
| 6,621,395 | B1 * | 9/2003 | Bromberg | H01F 6/008 335/216 |
| 7,183,766 | B2 | 2/2007 | Ito et al. | |
| 7,859,374 | B2 | 12/2010 | Iwasa et al. | |
| 2007/0171014 | A1 * | 7/2007 | Iwasa | G01R 33/3815 335/216 |
| 2009/0212890 | A1 | 8/2009 | Saho et al. | |

OTHER PUBLICATIONS

S. Kim, S. Fukada, R. Nomura and H. Ueda, "Development of HTS Bulk NMR Relaxometry With Ring-Shaped Iron," in IEEE Transactions on Applied Superconductivity, vol. 28, No. 3, pp. 1-5, Apr. 2018 (Year: 2018).*

Nakamura et al., Journal of Magnetic Resonance 259 (2015), 68-75.

Tsuchimoto et al., "One-dimensional stress evaluation of a ring bulk HTS with shrinkage fit by an iron ring" Physics Procedia 81 (2016), 170-173Physics Procedia 81 (2016), 170-173.

Kim et al, I"Study on Trapped Field Characteristics of HTS Bulk Annuli With Iron Rings for Ferromagnetic Shimming of a Compact NMR Magnet", IEEE Transactions on applied superconductivity, vol. 19, No. 3, Jun. 2009, 2273-2276.

Kim et al., "Development of HTS Bulk NMR Relaxometry With Ring-Shaped Iron", IEEE Transactions on applied superconductivity, vol. 28, No. 3, Apr. 2018, 5 pages, 4301505.

Fujishiro et al. , Superconductor Science and Technology, 29 (2016), 11 pages. 084001.

B. Gony et al., "Improvement of the Magnetization of a Superconducting Bulk using an Iron Core", IEEE/CSC superconductivity news forum (global edition) Jan. 2015, ASC 2014 manuscript 3LPo2H-04, 5 pages.

B. Gony et al., "Magnetization and demagnetization studies of a HTS bulk in a symmetrical iron core", conference paper, Oct. 2015, 2 pages.

Ainslie et al, "Enhanced trapped field performance of bulk high-temperature superconductors using split coil, pulsed field magnetization with an iron yoke", Supercond. Sci. Technol. 29 (2016), 074003, 17 pages.

Itoh et al., "Improvement in Magnetic Shielding by the Superposition of a Magnetic Cylinder Over a Copper-Oxide Superconducting Cylinder", IEEE transactions on applied superconductivity, vol. 3, No. 1, Mar. 1993, 181-184.

Itoh et al., "Magnetic Shielding Effects by the Superposition of a Six-Layered Ferromagnetic Cylinder over a BPSCCO Cylinder", IEEE transactions on magnets, vol. 32, No. 4, Jul. 1996, 2605-2608.

Lousberg et al., "Numerical Study of the Shielding Properties of Macroscopic Hybrid Ferromagnetic/Superconductor Hollow Cylinders", IEEE transactions on applied superconductivity, vol. 20, No. 1, Feb. 2010, 33-41.

Iwasa et al: "HTS and NMR/MRI magnets: Unique features, opportunities, and challenges", Physica C, North-Holland Publishing,Amsterdam, NL,vol. 445-448, pp. 1088-1094.

Nakamura et al: "Development of a superconducting bulk magnet for NMR and MRI", Journal of Magnetic Resonance, Academic Press, Orlando, FL, US, vol. 259, Aug. 7, 2015,pp. 68-75.

* cited by examiner

SUPERCONDUCTING MAGNET APPARATUS AND METHOD FOR MAGNETIZING A SUPERCONDUCTOR BULK MAGNET BY FIELD COOLING THROUGH A FERROMAGNETIC SHIELD

CROSS REFERENCE TO RELATED APPLICATIONS

This application claims foreign priority under 35 U.S.C. § 119(a)-(d) to European Application No. 19170280.2 filed on Apr. 18, 2019, the entire contents of which are hereby incorporated into the present application by reference.

FIELD OF INVENTION AND BACKGROUND

The invention relates to a superconductor magnet apparatus, comprising a superconductor bulk magnet with a superconductor bore, wherein the superconductor bulk magnet has an axis z of rotational symmetry, and a maximum outer diameter $OD_{bm}$ in a plane perpendicular to the axis z of rotational symmetry, and the superconductor bore has a minimum cross-sectional area $S_{bo}$ in a plane perpendicular to the axis z of rotational symmetry, a cryostat with a room temperature bore, wherein the superconductor bulk magnet is arranged within the cryostat, and the room temperature bore is arranged within the superconductor bore, and a ferromagnetic shielding body with a shielding bore, wherein the superconductor bulk magnet is arranged within the shielding bore of the ferromagnetic shielding body and the ferromagnetic shielding body extends beyond the superconductor bulk magnet at each axial end with respect to the axis z of rotational symmetry by at least $OD_{bm}/3$, and further wherein for an average cross-sectional area $S_{fb}$ of the ferromagnetic shielding body, defined as the average of the cross-sectional areas of the ferromagnetic shielding body in all the planes perpendicular to the axis z of rotational symmetry and intersecting the ferromagnetic shielding body, $S_{fb} \geq 2.5 \ast S_{bo}$ applies.

Such a superconductor magnet apparatus is known from U.S. Pat. No. 7,859,374 B2.

Superconductors carry an electric current at practically no ohmic losses. The superconducting state of a superconductor is only assumed below a critical temperature $T_{crit}$, which is in the cryogenic range, and depends on the superconductor material used. Superconductors can be used to generate strong magnetic fields. The magnetic field is generated by an electric current running within the superconductor, typically wherein the superconductor forms a coil or ring for this purpose ("superconductor magnet"), and the magnetic field is obtained in a superconductor bore. In particular, the electric current can run in a closed superconducting electric circuit at a practically constant current strength, without a need for a connection to an electric current source once charged ("persistent mode").

Coil type superconductor magnet apparatus are typically charged with a directly connected electric current source, and when the charging is complete, a superconducting switch is closed to establish the persistent mode.

For superconductor bulk magnets, which are based on closed ring-shaped superconducting structures, no electric contacts are necessary. Superconductor bulk magnets may be charged by a procedure known as "field cooling", e.g. described in U.S. Pat. No. 7,859,374 B2. In this procedure, the superconductor bulk magnet located within a cryostat is placed in an electrical charger magnet. Initially, the temperature of the superconductor bulk magnet is kept above $T_{crit}$, and the electrical charger magnet is ramped up until a desired magnetic field (or magnetic flux density) has been reached. Then the temperature within the cryostat is lowered below $T_{crit}$, so that the superconductor bulk magnet becomes superconducting. Then the electrical charger magnet is ramped down. During this procedure, superconducting electric currents are induced within the superconductor bulk magnet, opposing the change of magnetic flux, and as a result trapping (or conserving) the magnetic field (or magnetic flux density) within a superconductor bore of the superconductor bulk magnet. Then the superconductor bulk magnet together with its cryostat may be removed from the electrical charger magnet. As long as the superconductor bulk magnet is kept sufficiently cold, and in particular below $T_{crit}$, the magnetic field within the superconductor bore stays constant and can be used, for example for NMR measurements. For accessing the trapped magnetic field in an experiment, such as an NMR experiment, the cryostat should provide a room temperature bore, which in turn is arranged within the superconductor bore.

However, the superconductor bulk magnet not only generates (or conserves) a magnetic field in its superconductor bore, but also generates a magnetic field on its outer side ("stray field"). This outside stray field is in general not desired, since it may disturb electrical equipment nearby, and even may be dangerous to persons carrying for example a pacemaker.

U.S. Pat. No. 7,859,374 B2 proposes to place a shielding of steel sheets around the cryostat containing a superconductor bulk magnet after the electrical charger has been removed.

The shielding of the steel sheets will reduce the stray field, and thus minimize disturbances and dangers in the vicinity of the superconductor bulk magnet. However, many applications require a high homogeneity and stability of the magnet field (or magnetic flux density) within the superconductor bore. The shielding will influence the homogeneity, and even small inaccuracies in placing the shielding will significantly deteriorate the homogeneity within the superconductor bore. Moreover, the shielding body temperature is subject to temperature fluctuation of the environment, thus making it difficult to achieve stability of the magnetic field over time within the superconductor bore. Further, moving the shielding over the cryostat containing the charged superconductor bulk magnet will require to control large mechanical force, since the magnetic stray field of the superconductor bulk magnet will attract the iron shield, making this procedure cumbersome and time-consuming.

U.S. Pat. No. 7,183,766 B2 describe a superconducting magnetic field apparatus for a sputtering application. A ring shaped superconductor body is placed inside a thermal insulation vessel, together with ferromagnetic lower yoke below the superconductor body. In one embodiment, a ferromagnetic ring yoke located lateral of the superconductor body contributes in limiting the interior of thermal insulation vessel. On the top side of the thermal insulation vessel, the yoke ring extension with respect to the superconductor bulk is small so that a magnetic field spreads outside the thermal insulation vessel, making it possible to take part in sputtering applications. The ferromagnetic yokes are intended for shaping said magnetic field used in the sputtering application. The superconductor body is charged by a field cooling process.

Metal rings of different type have been proposed to be attached to superconductor bulk rings in order to address hoop stresses. The metal rings are not suited for magnetic shielding, in particular since they do not extend sufficiently in axial direction beyond the superconductor bulk, and/or since they are too thin, and/or made of non-magnetic or diamagnetic material:

T. Nakamura et al., Journal of Magnetic Resonance 259 (2015), 68-75, disclose a superconducting bulk magnet for NMR and MM applications, comprising six $EuBa_2Cu_3O_y$ rings inserted in aluminium rings to resist hoop stress.

M. Tsuchimoto and M. Morita, Physics Procedia 81 (2016), 170-173, disclose a stress evaluation for ring bulk HTS during field cooling. The ring bulk HTS are arranged in iron rings to resist hoop stresses.

Metal rings of different type have also been proposed to be attached to superconductor bulk rings for shimming purposes. The metal rings again are not suited for magnetic shielding, in particular since they are too thin, and/or not positioned outside the superconductor magnet:

S. Kim et al, IEEE Transactions on applied superconductivity, Vol. 19, No. 3, June 2009, 2273-2276, describe trapped field characteristics of HTS bulk annuli with iron rings for ferromagnetic shimming, located inside the HTS bulk annuli.

S. Kim et al., IEEE Transactions on applied superconductivity, Vol. 28, No. 3, April 2018, 4301505, describe field-cooled stacked GdBCO bulk annuli, inserted in thin iron rings for field homogenisation.

Further it is known to use iron in the vicinity of a superconductor bulk magnet in order to augment the magnetization of the bulk magnet. The iron is often placed outside the cryostat, and/or the bulk magnets have no superconductor bore, and/or charging is done from within the cryostat:

H. Fujishiro et al., Supercond. Sci. Technol. 29 (2016), 084001, proposes a $MgB_2$ bulk, with no bore, arranged in a cryostat, with the cryostat arranged between soft iron yokes.

B. Gony et al., IEEE/CSC superconductivity news forum (global edition) January 2015, ASC 2014 manuscript 3LPo2H-04, proposes an E-I type iron core about a superconductor bulk, with no bore, and with a charger coil also arranged within the I-E type iron core.

B. Gony et al., "Magnetization and demagnetization studies of a HTS bulk in a symmetrical iron core", conference paper, October 2015, downloadable at https://www.researchgate.net/publication/283056767 also describes an YBCO bulk, with no bore, surrounded by a magnetization coil, with the YBCO bulk and the magnetization coil surrounded by an iron core.

M. D. Ainslie et al, Supercond. Sci. Technol. 29 (2016), 074003, describes enhanced trapped field performance of bulk HTS, with HTS bulks, having no bore, arranged between iron yoke parts. The bulk HTS are placed in a cooled copper clamp sample holder.

JP H07 201 560 describes a magnetic field generating method and device, wherein and YBCO bulk superconductor, which has no bore, is placed below a ferromagnetic frame, and with an electromagnetic coil located engaging in the ferromagnetic frame. The YBCO superconductor bulk, the electromagnetic coil and the ferromagnetic frame are located within a cryogenic vessel. The device provides a strong magnetic field for magnetic levitation and the like.

There are also experiments investigating the blocking effect of combinations of superconductor cylinders arranged in ferromagnetic cylinders for keeping external magnetic fields out of the interior of the superconductor cylinder; in these experiments, no field cooling was applied, and/or the superconductor cylinders were too small for accessing a superconductor bore with a sample in a room temperature bore, and/or did not describe a room temperature bore or a cryostat at all:

M. Itoh et a., IEEE transactions on applied superconductivity, Vol. 3, No. 1, March 1993, 181-184 investigated the magnetic field within an YBCO cylinder of 5 mm inner diameter and 19 mm length within a soft iron cylinder of 75 mm length, and the magnetic field inside the YBCO cylinder was measured using a Hall device operated at 77 K.

M. Itoh et al., IEEE transactions on magnets, Vol. 32, No. 4, July 1996, 2605-2608, investigated the shielding effects of up to 6 layered 60 mm long ferromagnetic cylinders over 30 mm long BPSCCO cylinders with an inner diameter of 2.9 mm and a thickness of 2.6 mm.

G. P. Lousberg et al., IEEE transactions on applied superconductivity, Vol. 20, No. 1, February 2010, 33-41 report on finite element model calculations on the penetration of an external magnetic field into an arrangement of a cylinder-wall shaped HTS surrounded by a cylinder-wall shaped ferromagnetic cylinder of identical axial length.

SUMMARY

It is an object of the invention to provide a superconductor magnet apparatus, with which a magnetic field (or magnetic flux density) of a good homogeneity and stability over time can be provided in a simple way.

Short Description of the Invention

This object is achieved, in accordance with one formulation of the invention, by a superconductor magnet apparatus as introduced in the beginning, characterized in that the ferromagnetic shielding body is arranged within the cryostat.

The invention proposes to include the ferromagnetic shielding body, which protects the environment from undesired or even dangerous stray fields, within the cryostat. As a consequence, when applying the magnetic field (or magnetic flux density) of an electrical charger magnet during a "field-cooling" charging procedure, the magnetic field has to penetrate the ferromagnetic shielding, so only a reduced strength of the magnetic field will be present at the superconductor bulk magnet as compared to a situation when no ferromagnetic shielding body is present during the charging procedure. Accordingly, to achieve the same trapped magnetic field strength as compared to the situation with no ferromagnetic shielding body in the cryostat, the electrical charger magnet has to provide a somewhat stronger magnetic field (or magnetic flux strength). On the other hand, including the ferromagnetic shielding body inside the cryostat in accordance with the invention, as compared to arranging a ferromagnetic shielding body about the cryostat subsequent to the charging procedure, provides a number of associated benefits:

First of all, subsequent placement of a ferromagnetic shielding body about the charged superconductor bulk magnet requires control of high mechanical forces, since the trapped magnetic field (or magnetic flux density) outside the superconductor bulk magnet tries to attract the ferromagnetic shielding body. By placing the ferromagnetic shielding body inside the cryostat—and therefore having the ferromagnetic shielding body in place before the charging begins—this cumbersome step can be avoided completely.

Further, the ferromagnetic shielding body will influence the trapped magnetic field (or magnetic flux density), and thus the homogeneity of the trapped magnetic field (or magnetic flux density) inside the superconductor bore. When subsequently placing the ferromagnetic shielding body around the cryostat, the accuracy of this mounting is typically relatively poor because the mounting has to be done in the presence of magnetic forces. In contrast, the ferromagnetic shielding body inside the cryostat can be permanently fixed, and can be accurately aligned at this time, typically during manufacturing of the superconductor magnet apparatus, without impediments by magnetic forces. For this reason, apparatus according to the present invention can achieve a higher homogeneity in a simple way.

Moreover, the stability of the trapped magnetic field will be influenced by variation of the temperature of the ferromagnetic shielding body. By placing the ferromagnetic shielding body inside the cryostat, the temperature of the ferromagnetic shielding body is automatically stabilized.

The axial extension of the ferromagnetic shielding body beyond the superconductor bulk magnet and the ratios of the cross-sectional areas of the ferromagnetic shielding body and the superconductor bore of the superconductor bulk magnet, provided by the invention, ensure that a sufficient shielding effect, i.e. protection of the environment against stray fields, can be achieved. As a result, the inventive apparatus may be used e.g. in laboratories and hospitals without further protective measures. In accordance with the invention, $S_{fb} \geq 2.5 * S_{bo}$, and typically, $S_{fb} \geq 4 * S_{bo}$ or $S_{fb} \geq 10 * S_{bo}$ also applies. Further, typically the ferromagnetic shielding body axially extends beyond the superconductor bulk magnet at each axial end by at least $OD_{bm}/3$, or preferably at least $OD_{bm}/2$, and typically also by at least $1*(OD_{bm}-ID_{bm})$, preferably at least $2*(OD_{bm}-ID_{bm})$, with $ID_{bm}$ being a minimum inner diameter of the superconductor bulk magnet.

So in summary, according to the invention, a better homogeneity and stability of the trapped magnetic field (or magnetic flux density) can be achieved in a simple way, since the ferromagnetic shielding body can be accurately aligned and permanently fixed, and its temperature may be well controlled inside the cryostat, typically together with the superconductor bulk magnet without need for an additional controlling device. Note that the superconductor bulk magnet and the ferromagnetic shielding body may be at the same temperature or at different temperatures inside the cryostat, depending on their placement with respect to a cooling device (cold head) and/or heat transporting structures.

Typically, the superconductor bulk magnet and the ferromagnetic shielding body are designed at least basically cylinder-wall shaped. In general, the cryostat, the ferromagnetic shielding body and the superconductor bulk magnet (as well as an electrical charger magnet used for charging) are arranged coaxially along the axis z of rotational symmetry of the superconductor bulk magnet. Cross-sections are taken perpendicular to the axial direction, defined by the (central) axis z of rotational symmetry of the superconductor bulk magnet.

The superconductor bulk magnet may be equipped with a corseting structure, in particular outside metal (e.g. steel, aluminum or copper) rings as mechanical reinforcement.

The ferromagnetic shielding body may be made of one piece, but may also comprise parts fixed to each other. Note that in general, gaps are avoided in the ferromagnetic shielding body, in order to minimize magnetic stray field outside the ferromagnetic shielding body; however minor gaps may be tolerated, e.g. gaps smaller than ⅕ of the local radial wall thickness. Note that the ferromagnetic shielding body may act as a radiation shield within the cryostat.

The room temperature bore may be accessible from two sides (through hole) or from one side only. Inside the room temperature bore, a sample may be located for investigation.

The superconductor bulk magnet is typically made of a HTS material such as ReBCO, in particular YBCO, or of $MgB_2$. The ferromagnetic shielding body is positioned within the cryostat at a distance from an outer wall of the cryostat, typically separated by vacuum from the outer wall of the cryostat. Typically, both the superconductor bulk magnet and the ferromagnetic shielding body are immovably fixed within the cryostat.

The superconductor bulk magnet may comprise a stack of superconductor rings. Typically, the superconductor rings are stacked in axial sequence. However, it is also possible to have concentric superconductor rings stacked in radial sequence ("nested rings"). In general, the superconductor bulk magnet is of a closed ring shape, made of a single superconductor ring structure or of a plurality of ring-shaped superconductor sub-structures such as discs or coatings on a substrate (such as a sheet metal or a foil); the ring-shaped sub-structures are arranged coaxially and stacked axially and/or radially, and may be combined into a so-called "composite bulk" by structurally connecting the sub-structures. All these variants constitute superconductor bulk magnets, in accordance with the invention. Structures or sub-structures for a superconductor bulk magnet may be grown from a melt; sub-structures to be combined into a "composite bulk" are typically made by coating a substrate. A superconductor bulk magnet, in accordance with the invention, allows a trapping of a magnetic field (or magnetic flux density) in its superconductor bore, wherein the superconductor bulk magnet in general does not possess any electric current supplies, but instead is designed for inductive charging only.

Preferred Embodiments of the Invention

In a preferred embodiment of the inventive superconductor magnet apparatus, for a minimum inner diameter $ID_{bm}$ of the superconductor bulk magnet applies $ID_{bm} \geq 20$ mm, preferably $ID_{bm} \geq 30$ mm, most preferably $ID_{bm} \geq 40$ mm. Such dimensions give enough space for construction the room temperature bore for access of a sample within the superconductor bore, and allowing a convenient placement of the sample to be investigated, e.g. by NMR experiments. Typically, the room temperature bore of the cryostat has a minimum diameter of 10 mm or more, preferably 20 mm or more.

Preferred is also an embodiment wherein the superconductor bulk magnet has an axial length $L_{bm}$ in the direction of the axis z of rotational symmetry, with $L_{bm} \geq 2.5 * ID_{bm}$, with $ID_{bm}$ being a minimum inner diameter of the superconductor bulk magnet. With such a length $L_{bm}$, the superconductor bulk magnet can achieve a good homogeneity of a residual magnetic flux density $B_{bo}$ in its superconductor bore.

In an advantageous embodiment, the ferromagnetic shielding body comprises ferromagnetic end caps which reach radially inwards over at least a part of the radial thickness of the superconductor bulk magnet at each axial end. By means of the end caps, an improvement of the shielding function and/or a more compact design may be achieved. The end caps at the two axial ends (top end cap and bottom end cap) are typically symmetric with respect to a magnet mid plane. In other embodiments, the ferromagnetic shielding body may comprise only one ferromagnetic end cap, e.g. on the side opposing a room temperature bore access; the end cap may reach radially inward over at least a part of the radial thickness of the superconductor bulk magnet at one axial end. If desired, end caps may be separated by spacers from a main (cylindric) part of the ferromagnetic shielding body.

Preferred is an embodiment wherein the cryostat comprises a controller device for controlling the temperature of the ferromagnetic shielding body. By means of the controller device, a higher level of thermal stability of the temperature of the ferromagnetic shielding body can be achieved, which improves the temporal stability of the magnetic flux density at the magnetic center of the superconductor bulk magnet or the sample volume, respectively. The controller device may be a controller of a cooling device (such as a pulse tube cooler) of the cryostat. Typically, the controller device comprises a temperature sensor located inside the cryostat, in particular attached to the ferromagnetic shielding device.

In another preferred embodiment, the ferromagnetic shielding body is designed with a cylinder-wall shape, or with a basically cylinder-wall shape having a varying outer diameter and/or inner diameter along the axial direction, in particular with a varying radial thickness along the axial direction, and/or a varying radial thickness as a function of an azimuthal angle position, in particular with grooves along the axial direction, and/or boreholes. With an at least basically cylinder-wall shaped ferromagnetic shielding body, a good level of homogeneity of the trapped magnetic flux density may be achieved. By specifically shaping the ferromagnetic shielding body, the homogeneity of the residual magnetic flux density conserved by the superconductor bulk magnet may be improved. Note that in general, in accordance with the invention, the trapped magnetic field (or magnetic flux density) within the superconductor magnet bore typically achieves (after having removed the apparatus from the charger magnet) a homogeneity of 100 ppm or better in a sample volume of at least 5 mm$^3$ within the room temperature bore, or a homogeneity of 10 ppm or better in a sample volume of at least 1 mm$^3$ within the room temperature bore, without further shimming measures (such as active shimming with a shimming device located in the room temperature bore). The sample volume is in general located at the magnetic center of the superconductor bulk magnet.

Particularly preferred is an embodiment, wherein the superconductor bulk magnet is in a charged state, wherein a residual magnetic flux strength $B_{bo}$ is conserved by the superconductor bulk magnet at its magnet magnetic center. In the charged state, the inventive apparatus is typically transported to a site of application, and used in this application by inexpensively providing the (typically relatively high strength and high homogeneity) residual magnetic flux density $B_{bo}$ for a sample to be investigated. In the charged state, superconducting circular electric currents run through the superconductor bulk magnet without ohmic losses, and the superconductor bulk magnet is kept at a temperature $T_{bm}$ well below its critical temperature $T_{crit}$ (typically with $T_{bm} \geq \frac{2}{3} \cdot T_{crit}$ or even $T_{bm} \geq 0.5 \cdot T_{crit}$, with the temperatures in Kelvin). Note that the magnetic center of the superconductor bulk magnet (and, more generally speaking, of the superconductor magnet apparatus) is in general a point on the axis of rotational symmetry (z) located at $+/-0.1 \cdot L_{bm}$ from a point located on the axis of rotational symmetry (z) and at equal distance from the top and the bottom of the superconductor bulk magnet.

In a preferred further development of the above embodiment, $B_{bo} \geq 3.5$ Tesla, preferably $B_{bo} \geq 5.0$ Tesla, most preferably $B_{bo} \geq 7.0$ Tesla. Such high magnetic flux densities would be rather expensive to provide by other means, so the invention is particularly advantageous in this further development. $B_{bo}$ is measured at the magnetic center (or in the sample volume, respectively); however field variation within the superconductor bore is typically small. Note that in other embodiments, $B_{bo}$ may be in a range of $B_{bo} \geq 1.5$ Tesla or $B_{bo} \geq 2.5$ Tesla.

Also preferred is a further development wherein the superconductor magnet apparatus, in particular the ferromagnetic shielding body, is configured such that a magnetic stray field everywhere outside the room temperature bore and outside the cryostat has a magnitude of 15 Gauss or less, preferably 5 Gauss or less. With the ferromagnetic shielding body within the cryostat, in general a low stray field outside the cryostat may be achieved without further measures, in particular a stray field of 5 Gauss or less. Note that the cryostat or parts of the cryostat, such as an outer cryostat wall, may be made of ferromagnetic material such as iron to lower the stray field. If the stray field outside the cryostat is in a range a little higher than 5 Gauss, such as up to 15 Gauss, a simple warm iron shielding casing (e.g. made of sheet metal) may be arranged about the cryostat, in order to achieve a stray field outside the warm iron shielding casing of 5 Gauss or less.

In a preferred further development, the ferromagnetic shielding body is at a magnetization of at least 70% of its maximum magnetization. In case of an inhomogeneous degree of magnetization, the degree of magnetization may be averaged over the ferromagnetic shielding body. When using (magnetizing) the ferromagnetic shielding body to such a high extent, a compact and low weight design may be achieved.

Also within the scope of the present invention is a charging arrangement, comprising an electrical charger magnet having a charger bore, and an inventive superconductor magnet apparatus described above, wherein the superconductor magnet apparatus is arranged at least partially within the charger bore. With the inventive charger arrangement, a compact shielded superconductor magnet apparatus may undergo a field-cooling procedure, wherein no strong mechanical force has to be controlled for putting a ferromagnetic shielding body in place, and wherein a good homogeneity and stability of the trapped magnetic flux density inside the superconductor bore may be simply achieved.

Further within the scope of the present invention is a use of an inventive superconductor magnet apparatus as described above, characterized in that a sample is arranged within the room temperature bore and exposed to said residual magnetic flux density $B_{bo}$ conserved by the superconductor bulk magnet at its magnetic center, and that an NMR measurement is performed on the sample in the room temperature bore. This is a simple and inexpensive way to do NMR experiments on samples to be investigated.

Moreover within the scope of the present invention is a method for charging a superconductor bulk magnet within a superconductor magnet apparatus, said superconducting magnet apparatus comprising the superconductor bulk magnet with a superconductor bore, wherein the superconductor bulk magnet has an axis z of rotational symmetry, and a maximum outer diameter $OD_{bm}$ in a plane perpendicular to the axis z of rotational symmetry, and the superconductor bore has a minimum cross-sectional area $S_{bo}$ in a plane perpendicular to the axis z of rotational symmetry, a cryostat with a room temperature bore, wherein the superconductor bulk magnet is arranged within the cryostat, and the room temperature bore is arranged within the superconductor bore, and a ferromagnetic shielding body with a shielding bore, wherein the superconductor bulk magnet is arranged within the shielding bore of the ferromagnetic shielding body and the ferromagnetic shielding body extends beyond the superconductor bulk magnet at each axial end with respect to the axis z of rotational symmetry by at least $OD_{bm}/3$, and further wherein for an average cross-sectional area $S_{fb}$ of the ferromagnetic shielding body, defined as the average of the cross-sectional areas of the ferromagnetic shielding body in all the planes perpendicular to the axis z of rotational symmetry and intersecting the ferromagnetic shielding body, $S_{fb} \geq 2.5 * S_{bo}$ applies, and wherein the ferromagnetic shielding body is arranged within the cryostat, in particular wherein the superconductor magnet apparatus is designed as an inventive superconductor magnet apparatus as described above, the method comprising the following steps:

Step a) placing the superconductor magnet apparatus at least partially within the charger bore of an electrical charger magnet;

Step b) applying at least one electrical current to the electrical charger magnet, thus generating a magnetic flux density within the charger bore such that an applied magnetic flux density $B_{app}$ is present at a magnetic center (MC) of the superconductor bulk magnet, and wherein a temperature $T_{bm}$ of the superconductor bulk magnet is above a critical temperature $T_{crit}$ of the superconductor bulk magnet;

Step c) lowering the temperature $T_{bm}$ below $T_{crit}$;

Step d) turning off the at least one electrical current at the charger magnet, wherein $T_{bm} < T_{crit}$, such that a residual magnetic flux density $B_{bo}$ is conserved at the magnetic center;

Step e) removing the superconductor magnet apparatus from the charger bore and keeping $T_{bm} < T_{crit}$.

In accordance with the invention, the superconductor bulk magnet is charged through the ferromagnetic shielding body, wherein the ferromagnetic shielding body is arranged within the cryostat. This avoids a subsequent positioning of the ferromagnetic shielding body relative to the superconductor bulk magnet, which would be both cumbersome (requiring control of mechanical forces) and difficult to do accurately (in general deteriorating the homogeneity of the conserved magnetic flux density). Further, by having the ferromagnetic shielding body within the cryostat, an intrinsic temperature control of the ferromagnetic shielding body can be achieved, which stabilizes the magnetic field. Further, a compact design becomes available, in particular suitable for table top applications of the superconductor magnet apparatus.

Note that in general, the charger magnet, the cryostat, the ferromagnetic shielding body and the superconductor bulk magnet are arranged coaxially along the axis z of rotational symmetry of the superconductor bulk magnet.

$B_{app}$ basically corresponds to $B_{bo}$, wherein $B_{bo}$ is the residual magnetic flux density inside the superconductor bore, at the magnetic center, conserved by the superconductor bulk magnet after the charger magnet has been switched off. However, due to in particular the finite length of the superconductor bulk magnet and the change in magnetization of the ferromagnetic shielding body during charging and after charging is finished, $B_{bo}$ slightly deviates from $B_{app}$ in practice. Note that $B_{app}$ often has to be chosen with some inhomogeneity, in order to establish a (more) homogenous $B_{bo}$ in the sample volume. Typically, both the superconductor bulk magnet and the ferromagnetic shielding body are immovably fixed within the cryostat.

The magnetic flux density of (i.e. within) the charger magnet is chosen large enough such that a penetration of the ferromagnetic shielding body is ensured. It should be noted that the magnetic flux density of the charger magnet is typically ramped up, for example linearly, until finally reaching a maximum value of the magnetic flux density.

Preferably, the at least one electrical current applied to the charger magnet is chosen such that $B_{app} < (S_{fb} * B_{sat})/S_{bo}$, most preferably with $B_{app} \leq 0.9 * (S_{fb} * B_{sat})/S_{bo}$, with $B_{sat}$ being the magnetic flux density at which the ferromagnetic shielding body is magnetically saturated. In this way it is ensured that after charging the ferromagnetic shielding body will be able to provide a good protection of the environment of the cryostat from undesired stray fields. Note that further, the design of the superconductor magnet apparatus, in particular $S_{fb}$ and $S_{bo}$ and the ferromagnetic shielding material may be chosen purposefully, too, in order to stick to the above condition. Further note that typically $B_{app} \geq 2.5 * B_{sat}$, or even $B_{app} \geq 4 * B_{sat}$.

Note that only $B_z$ (magnetic flux density component along the axial direction) is considered here.

In a preferred variant of the inventive method, in step b), the at least one electric current is chosen such that $B_{app} \geq 3.5$ Tesla, preferably $B_{app} \geq 5.0$ Tesla, most preferably $B_{app} \geq 7.0$ Tesla. Then the resulting $B_{bo}$ will also be, basically, $\geq 3.5$ Tesla or $\geq 5.0$ Tesla or $\geq 7.0$ Tesla. These high magnetic flux densities would be expensive and difficult to achieve by other means, so the benefits of the invention are particularly eminent then.

Preferred is further a variant wherein by choosing the shape of the superconductor bulk magnet and/or the shape of the ferromagnetic shielding body, and by controlling the temperature of the ferromagnetic shielding body in the cryostat after step e), the magnetic flux density on the axis of rotational symmetry (z) at a position of up to +5 mm and −5 mm with respect to the magnetic center (MC) is kept within 100 ppm of $B_{bo}$ after step e). Then particularly accurate measurements, such as NMR measurements, may be performed in the sample volume at the magnetic center inside the superconductor bore, within the room temperature bore.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DETAILED DESCRIPTION

It should be noted that the figures are schematic in nature, and some features may be shown in an exaggerated or understated way, in order to accentuate particular features of the invention.

Figure 1:
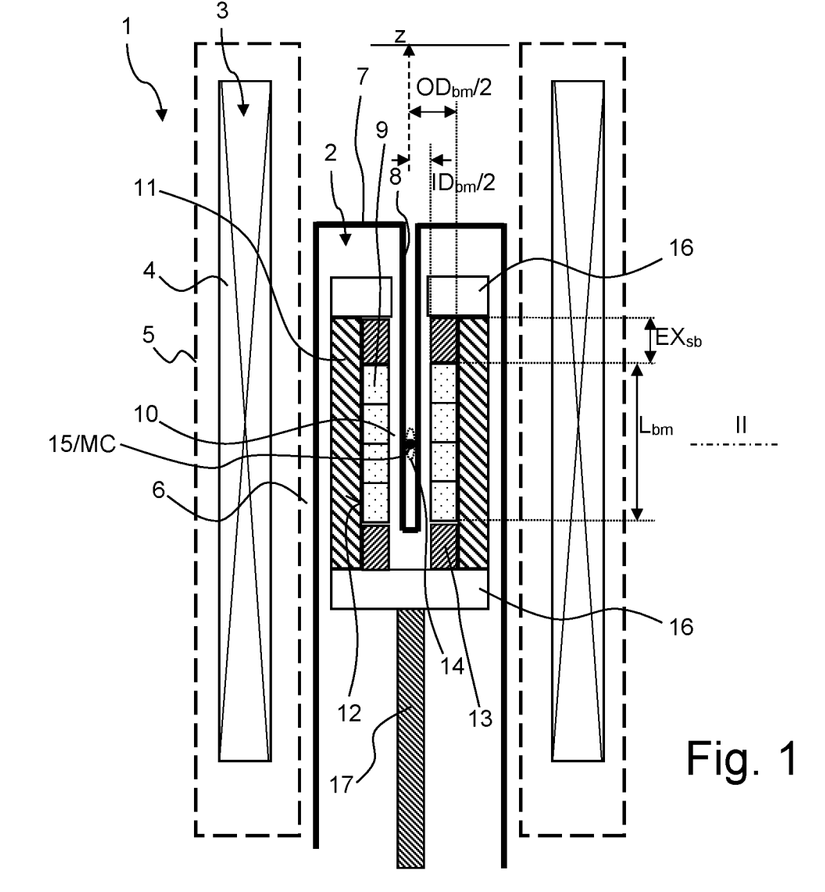
FIG. 1 shows a longitudinal section along the z axis of an exemplary embodiment of an inventive charging arrangement, comprising an inventive superconducting magnet apparatus and an electrical charger magnet.
Figure 2:
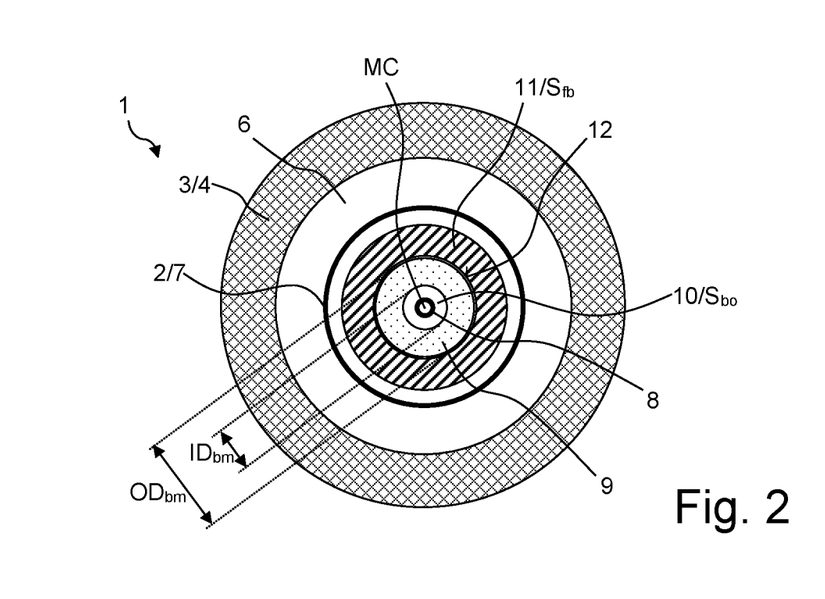
FIG. 2 shows a schematic cross-section of the charger apparatus of FIG. 1.

FIG. 1 shows schematically by way of example an inventive charging arrangement 1, comprising an inventive superconductor magnet apparatus 2 and an electric charger magnet 3. Note that a cross-section of the charging arrangement 1 at plane II is shown in FIG. 2 (without the charger cryostat, for simplicity); plane II is perpendicular to the axis z, which is the axis of rotational symmetry of the superconductor bulk magnet 9 of the superconductor magnet apparatus 2, and goes through the magnetic center of the superconductor bulk magnet 9.

In the example shown, the electrical charger magnet 3 comprises a basically cylinder-wall shaped charger coil 4 of here superconducting type, arranged in a charger cryostat 5. Inside the charger cryostat 5, a cryogenic temperature is present; however note that in other embodiments, also non-superconducting charger magnets may be used. The electrical charger magnet 3 generates, depending on the electrical current flowing through it, in its charger bore 6 a (charger) magnetic flux density. The electrical current at the charger magnet 3 may be controlled by an electronic control device (not shown).

Within the charger bore 6 is arranged the superconductor magnet apparatus 2. The superconductor magnet apparatus 2 comprises a cryostat 7 with a room temperature bore 8, which is here open to one side only (here top side). Note that for simplicity, a lower part of the cryostat 7 is not shown in FIG. 1. Inside the cryostat 7, there is arranged a superconductor bulk magnet 9, which is comprised here of four high temperature superconductor (HTS) rings arranged coaxially with the z-axis, so that in its entirety of all four rings, the superconductor bulk magnet 9 has a basically cylinder-wall shape with a rotational symmetry about axis z. The room temperature bore 8 of the cryostat 7 reaches into a superconductor bore 10 of the superconductor bulk magnet 9. Further, within the cryostat 7, there is arranged a ferromagnetic shielding body 11 of basically cylinder-wall shape. The superconductor bulk magnet 9 is arranged within a shielding bore 12 of the ferromagnetic shielding body 11.

The charger magnet 3 with its charger bore 6, the cryostat 7 with its room temperature bore 8, the ferromagnetic shielding body 11 with its shieling bore 12 and the superconductor bulk magnet 9 with its superconductor bore 10 are all arranged coaxially with the z axis.

Inside the cryostat 7, at least where the superconductor bulk magnet is located, the temperature may be varied from above a critical temperature $T_{crit}$ at which the superconductor bulk magnet 9 becomes superconducting, to below $T_{crit}$, for example by adding and removing a cryogenic fluid such as $LN_2$ or LHe in the cryostat 7 or by controlling a cooling head (not shown for simplicity), and if necessary activating and deactivating some heating in the cryostat 7, typically an electrical heating (not shown for simplification). The cryostat 7 typically comprises a vacuum insulation (not shown for simplification) or is evacuated.

In the example shown, the ferromagnetic shielding body 11 encompasses spacers 13 here made of non-magnetic material e.g. copper, which are roughly of ring shape and are placed below and on top of the superconductor bulk magnet 9, and reach radially inwards here over the entire radial thickness of the superconductor bulk magnet 9. In other embodiments, the spacers 13 may be replaced with ferromagnetic elements of the same size, then acting as ferromagnetic end caps and constituting part of the ferromagnetic shielding body 11. The spacers 13 and the ferromagnetic shielding body 11 are here axially encompassed by base structures 16, and the bottom base structure 16 is connected to a rod 17, for mechanical support and/or cooling. The base structures 16 and the rod 17 are made of non-magnetic material such as copper.

The ferromagnetic shielding body 11 extends in axial direction by an extension $EX_{sb}$ beyond the superconductor bulk magnet 9, both at its upper end and at its lower end. The superconductor bulk magnet 9 has a (maximum, with respect to all z positions) outer diameter of $OD_{bm}$, and a (minimum, with respect to all z positions) inner diameter $ID_{bm}$, which are both constant along z here. In the example shown, $EX_{sb}=OD_{bm}/2$ applies, and further, $EX_{sb}=(OD_{bm}-ID_{bm})$ applies. Note that $EX_{sb} \geq (OD_{bm}-ID_{bm})$, and in particular $EX_{sb} \geq 2*(OD_{bm}-ID_{bm})$ are preferred geometries, in accordance with the invention. Moreover, for the axial length $L_{bm}$ of the superconductor bulk magnet 9 here further applies $L_{bm}=3.5*ID_{bm}$.

The ferromagnetic shielding body 9 has a ring-shaped average cross-sectional area of $S_{fb}$, which can be directly seen in FIG. 2 since the cross-sectional area of the ferromagnetic shielding body 9 is constant here over z (note that in case of the cross-sectional area varying over z, an averaging should be performed to establish $S_{fb}$). The minimum cross-sectional area of the superconductor bore 10, i.e. the entire area within the inner edge of the superconductor bulk magnet 9, is $S_{bo}$, which again can be seen directly in FIG. 2 since the cross-sectional area of the superconductor bore 10 of the superconductor bulk magnet 9 is also constant here over z (note that in case of the cross-sectional area varying over z, the minimum cross sectional area should be chosen to establish $S_{bo}$). In the example shown, about $S_{fb}=10*S_{bo}$ applies, i.e. the average cross-section area $S_{fb}$ of the ferromagnetic shielding body 11 is much larger than the minimum cross-sectional area $S_{bo}$ of the superconductor bore 10.

Inside the room temperature bore 8, at the magnetic center MC of the superconductor bore 10, a sample volume 14 is located, at which a sample 15 to be investigated may be placed (typically after charging).

The charging arrangement 1 is used to charge (load) the superconductor bulk magnet 9 inductively with a superconducting current by a "field cooling" type procedure, in order to establish a residual magnetic flux density $B_{bo}$ at the magnetic center MC of the superconductor bulk magnet 9 or of the superconductor magnet apparatus 2, respectively. For this purpose, a charger magnetic field is applied to the superconductor bulk magnet 9 through the ferromagnetic shielding body 11, which are both located inside the cryostat 7, resulting in an applied magnetic flux density $B_{app}$ inside the superconductor bore 12 (see FIGS. 3-10 and FIG. 11 below), at the magnetic center MC. The superconductor magnet apparatus 2 may then be removed from the electrical charger magnet 3 and be transported to a site of application, where samples 15 in the sample volume 14 are investigated.

Figure 10:
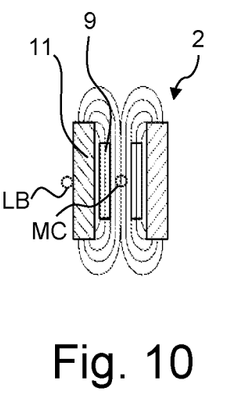
FIG. 10 shows the superconductor magnet apparatus of FIG. 3, after having been removed from the electric charger magnet.
Figure 11:
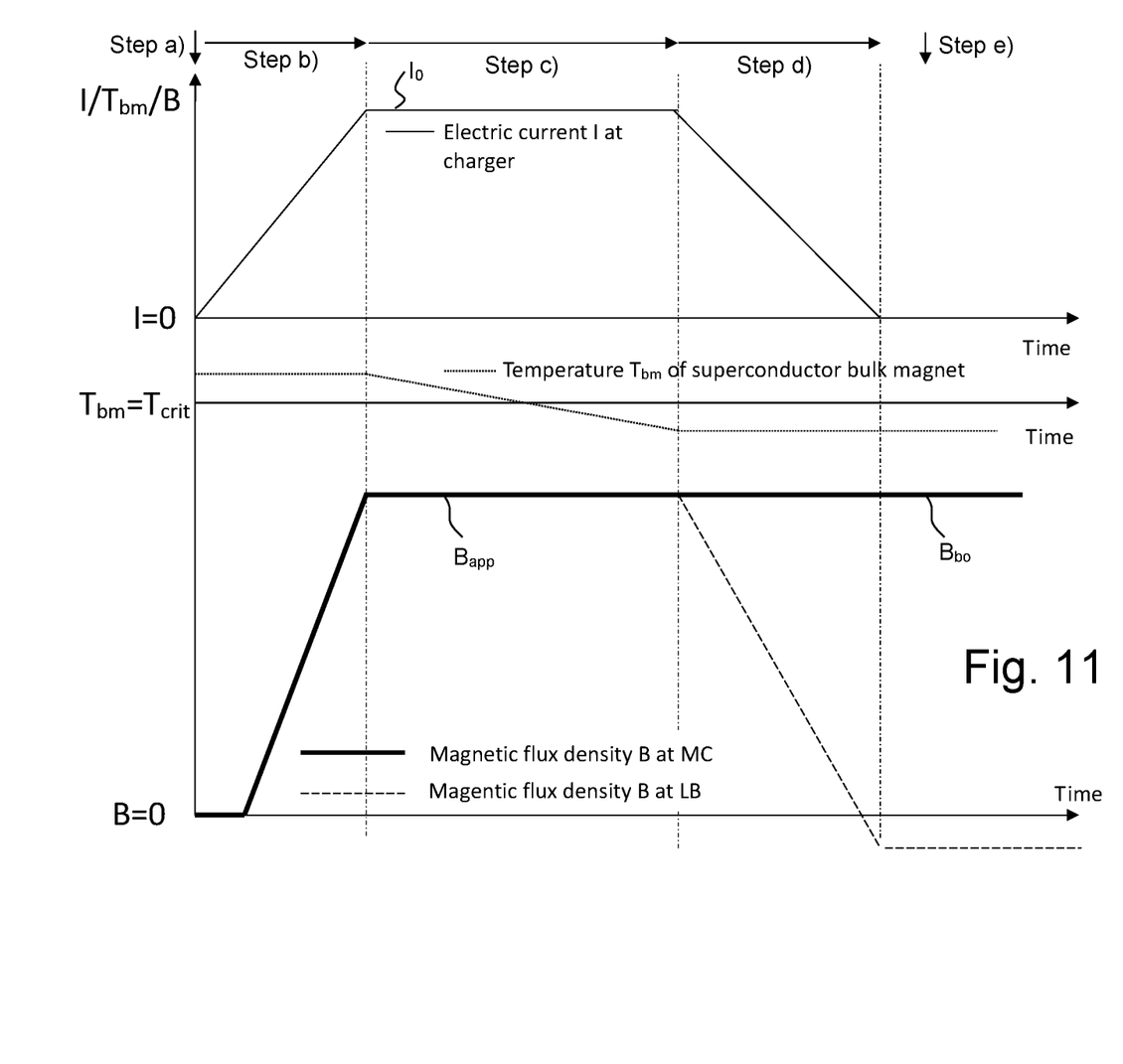
FIG. 11 shows a schematic diagram of the charger magnet current, the temperature of the superconductor bulk magnet and the magnetic flux densities at locations MC and LB (compare FIG. 3) as a function of time for the inventive method illustrated in FIGS. 3-10.

FIGS. 3 through 10 illustrate by way of example an inventive charging method, for charging a superconducting magnet apparatus 2 with an electrical charger magnet 9, as shown for example in FIG. 1 and FIG. 2. In FIGS. 3 through 10, a charger cryostat and a cryostat containing the ferromagnetic shielding body 11 and the superconductor bulk magnet 9 are not shown for simplification. FIG. 11 illustrates the electric current I applied at the electrical charger magnet 3 (in arbitrary units, top part), as well as the magnetic flux density B (in arbitrary units) at the magnetic center MC (bold curve bottom part) and LB (outside the ferromagnetic shielding body 11, but within the charger bore, dashed curve bottom part), as well as the superconductor bulk temperature $T_{bm}$ (in arbitrary units, dotted line middle part) as a function of time during the course of method.

Figure 3:
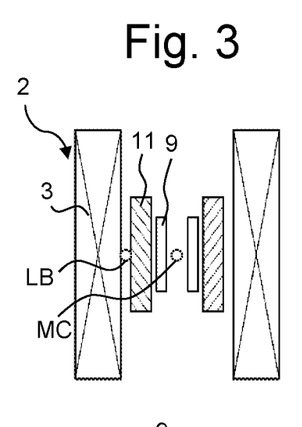
FIG. 3 shows schematically an inventive charger arrangement in a first stage of an exemplary variant of an inventive charging method, before loading the charger magnet.
Figure 4:
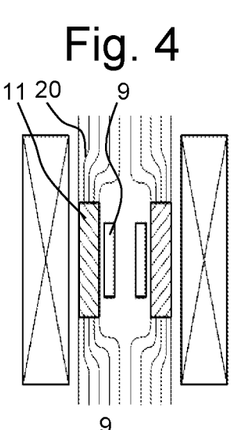
FIG. 4 shows the charger arrangement of FIG. 3 in a second stage, with a charger current so low that the ferromagnetic shielding body is not yet saturated.
Figure 5:
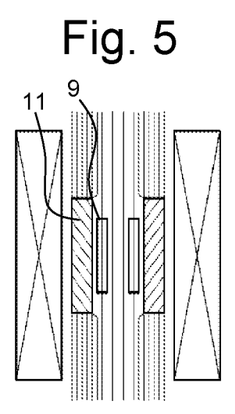
FIG. 5 shows the charger arrangement of FIG. 3 in a third stage, with the charger current high enough such that the ferromagnetic shielding body has become saturated and some magnetic flux penetrates the superconductor bulk magnet.

In step a), the superconductor magnet apparatus 2 is placed within the charger bore of the charger magnet 3, see FIG. 3. Before the charging of the charger magnet 3 begins, no current I is applied to the charger magnet 3, and a zero magnetic flux density B is present at both the magnetic center MC and the location LB, see FIG. 11. The superconductor bulk magnet 9 is at a temperature $T_{bm}$ above $T_{crit}$, and accordingly is not superconducting.

In step b), the electrical current I is increased (here linearly); this increases the magnetic flux density inside the charger bore. Initially, this does not result in a magnetic flux density at the magnetic center, since the ferromagnetic shielding body 11 shields its inside including the superconductor bulk magnet 9 and the magnetic center MC, and the magnetic flux density is also largely reduced at location LB, compare the field lines 20 in FIG. 4. When the electric current I increases further, the ferromagnetic shielding body 11 becomes saturated, and some magnetic flux density enters the superconductor bulk magnet 9, compare FIG. 5; Note that the superconductor bulk magnet 9 has no significant shielding effect in this situation, since it is not (yet) superconducting. Eventually, the electric current I at the charger magnet reaches its maximum $I_0$, and accordingly $B_{app}$ is reached at the magnetic center MC, compare FIG. 6. The relative shielding effect of the ferromagnetic shielding body 11 is rather weak in this situation, such that the penetrating magnetic flux density $B_{app}$ is close to the magnetic flux density inside the charger magnet 3 that would be present without the ferromagnetic shielding body 11. If a specific value of $B_{app}$ is desired within the superconductor bore, a slightly stronger electric current at the electrical charger magnet is required in the inventive field cooling method, as compared to a conventional field cooling without a ferromagnetic shielding body within the electrical charger magnet. The magnetic flux density at location LB basically corresponds to the magnetic flux density at the magnetic center MC in this stage.

Figure 6:
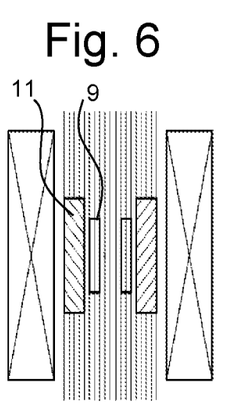
FIG. 6 shows the charger arrangement of FIG. 3 in a fourth stage, with the charger current having achieved its highest value, when the superconductor bulk magnet is to be cooled below its critical temperature.
Figure 7:
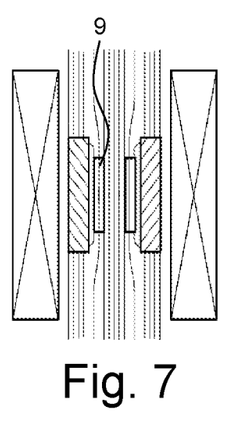
FIG. 7 shows the charger arrangement of FIG. 3 in a fifth stage, with the charger current somewhat reduced again.
Figure 8:
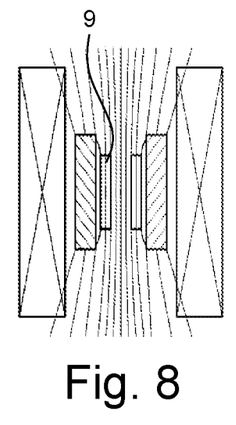
FIG. 8 shows the charger arrangement of FIG. 3 in a sixth stage, with the charger current further reduced.
Figure 9:
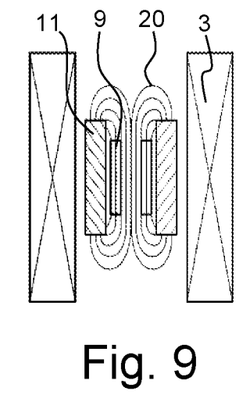
FIG. 9 shows the charger arrangement of FIG. 3 in a seventh stage, with the charger current reduced to zero, and a the residual magnetic field trapped by the superconductor bulk magnet.

In step c), the temperature $T_{bo}$ of the superconductor bulk magnet 9 is lowered below $T_{crit}$, so the superconductor bulk magnet 9 becomes superconducting. The electric current I at the charger magnet 3 remains unchanged at $I_0$, see FIG. 11. The magnetic flux density distribution basically remains as shown in FIG. 6.

In step d), the electric current I at the charger magnet 3 is lowered; accordingly the magnetic flux density generated by the charger magnet 3 decreases, which can be spotted by the magnetic flux density B at location LB, compare FIG. 11. The superconductor bulk magnet 9, now superconducting, keeps the magnetic flux it encloses in its superconductor bore constant by corresponding superconducting currents induced in the superconductor bulk magnet 9. Outside the superconductor bulk magnet 9, the magnetic field decreases, compare FIG. 7 and at a further decrease FIG. 8. In the final state, when the electric current I reaches zero, the magnetic field lines 20 generated by the superconductor bulk magnet 9 loop through the ferromagnetic shielding body 11, without significant spreading into the environment, compare FIG. 9. The magnetic flux density at the magnetic center MC is at $B_{bo}$, which basically corresponds to $B_{app}$ present before. The magnetic flux density outside the ferromagnetic shielding body 11, for example at location LB, has a low absolute value, and has here an opposite sign at location LB, as compared to the magnetic flux density before, at step c) for example, compare FIG. 11.

As long as the temperature $T_{bm}$ of the superconductor bulk magnet 9 is kept far enough below $T_{crit}$, the magnetic flux density $B_{bo}$ trapped inside the superconducting bulk magnet 9 or its superconductor bore, respectively, will remain constant.

In step e), the superconductor magnet apparatus 2, including the superconductor bulk magnet 9 and the ferromagnetic shielding body 11 as well as the cryostat (not shown) containing them is removed from the electrical charger magnet 3; FIG. 10 shows the superconductor magnet apparatus 2 already removed. The superconductor magnet apparatus 2 is then brought to a site of application, such as a laboratory, where it may be used for example in NMR experiments. The magnetic flux density at the magnetic center MC within the superconductor bore, and outside the ferromagnetic shielding body 11 at location LB (assuming that LB is chosen relative to the superconductor magnet apparatus 2), do not change upon this removal or the transport, compare FIG. 11. Accordingly, the superconductor magnet apparatus 2 is well shielded to protect the environment from stray fields, without the need to place a ferromagnetic shielding body after the charging requiring control of strong magnetic forces, and the superconductor magnet apparatus provides a strong magnetic field inside the superconductor bore. Further, since the ferromagnetic shielding body in accordance with the invention may be fixed inside the cryostat before the charging with high accuracy, the apparatus 2 allows for a good homogeneity of the magnetic field in the sample volume or inside the superconductor bore, respectively. Also, since the ferromagnetic shielding body is inside the cryostat and cooled together with the superconductor bulk magnet, the apparatus allows for a good field stability in the sample volume or inside the superconductor bore, respectively. Moreover, with the ferromagnetic shielding body inside the cryostat, a particularly compact design of the superconductor magnet apparatus 2 is possible.

Figure 12:
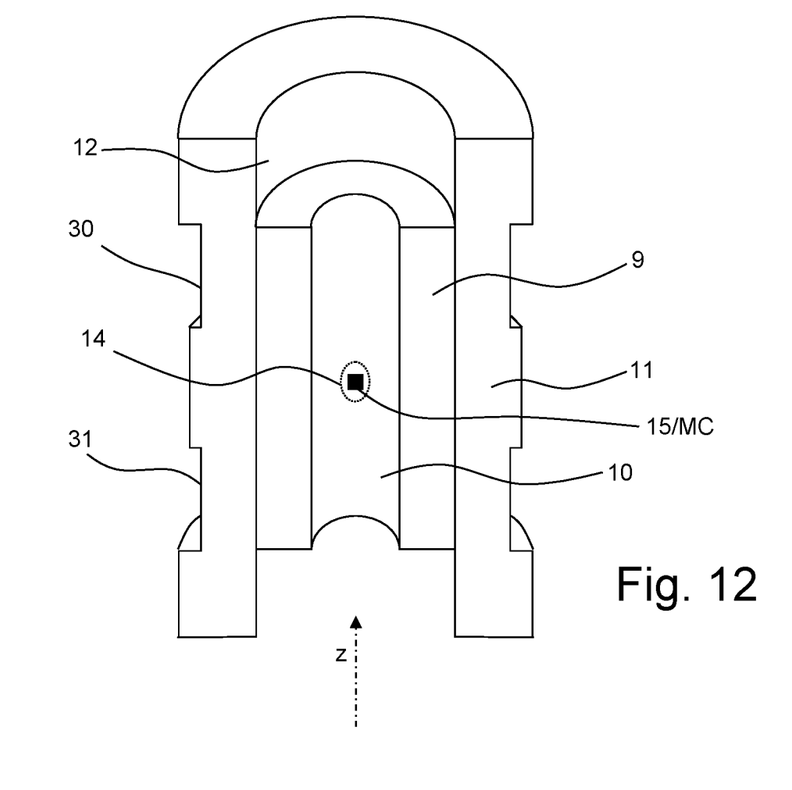
FIG. 12 shows an exemplary arrangement of a superconductor bulk magnet and a ferromagnetic shielding body for an inventive superconductor magnet apparatus, with the ferromagnetic shielding body showing circumferential grooves.

FIG. 12 shows by way of example an arrangement of a ferromagnetic shielding body 11 and a superconductor bulk magnet 9 placed in the shielding bore 12, for an inventive superconductor magnet apparatus 2. In the example shown, the ferromagnetic shielding body 11 is basically cylinder-wall shaped, but exhibits a profile on its outside with here two circumferential grooves 30, 31. In other words, the radial thickness varies here as a function of the axial position (z-position) at the ferromagnetic shielding body 11. By such a structuring, the homogeneity of the magnetic flux density in the superconductor bore 10 or, more specifically, at the sample volume 14 where the sample 15 is placed, may be influenced and in particular improved. Further structuring of the ferromagnetic shielding body 11 may include grooves in axial direction or boreholes (not shown).

Figure 13:
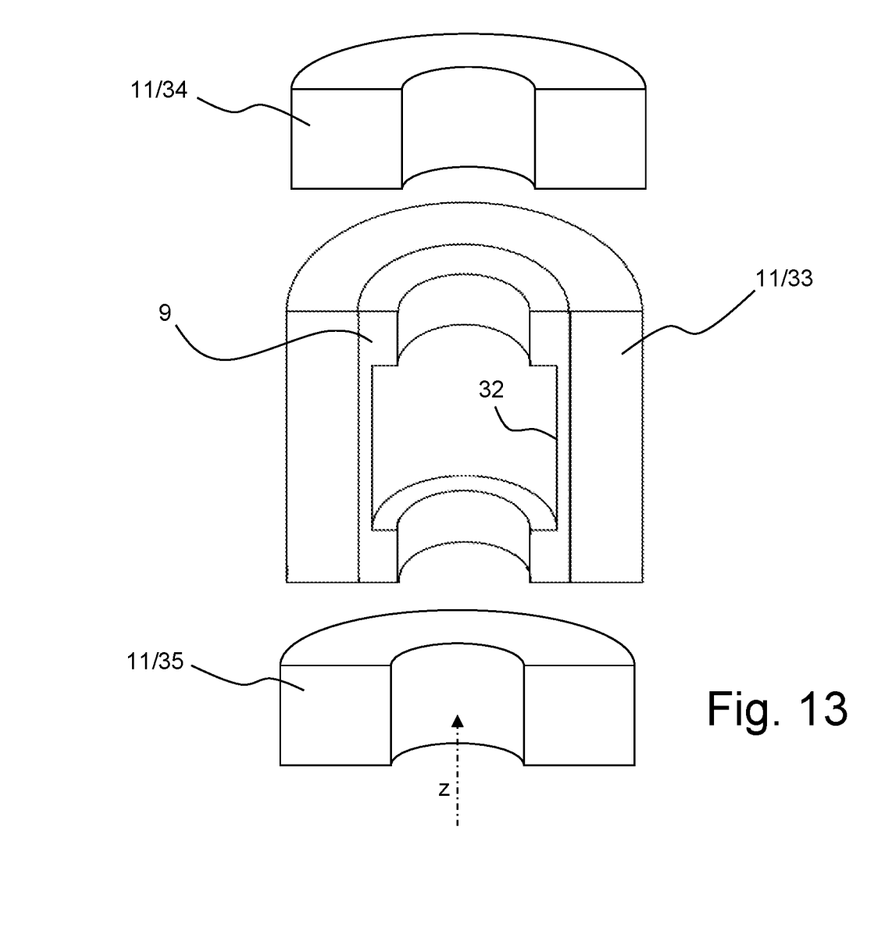
FIG. 13 shows a further exemplary arrangement of a superconductor bulk magnet and a ferromagnetic shielding body with end caps for an inventive superconductor magnet apparatus, with the superconductor bulk magnet showing a circumferential groove.

It should be noted that, alternatively or in addition, the superconductor bulk magnet 9 may comprise a structuring, too, in particular a varying radial thickness along the axial direction (z direction), compare FIG. 13. Here, the superconductor bulk magnet 9 comprises a circumferential groove 32 at its inside. The ferromagnetic shielding body 11 here comprises a main body 33 which is cylinder-wall shaped, and two ferromagnetic end caps 34, 35 (here shown lifted up, for better understanding), which are in use preferably axially adjacent or at least placed in close axial vicinity to the superconductor bulk magnet 9 and reach radially inward over the superconductor bulk magnet 9.

LIST OF REFERENCE SIGNS 1 charging arrangement
2 superconductor magnet apparatus
3 electrical charger magnet
4 charger coil
5 charger cryostat
6 charger bore
7 cryostat (for ferromagnetic shielding body and superconductor bulk magnet)
8 room temperature bore
9 superconductor bulk magnet
10 superconductor bore
11 ferromagnetic shielding body
12 shielding bore
13 spacer
14 sample volume
15 sample
16 base structure
17 rod
20 magnetic field line
30 groove
31 groove
32 groove
33 main body
34 end cap
15 end cap
B magnetic flux density
$B_{app}$ applied magnetic flux density
$B_{bo}$ residual magnetic flux density
$EX_{sb}$ axial extension of the ferromagnetic shielding body over the superconductor bulk magnet
I electric current (applied at the charger magnet)
$I_0$ maximum electrical current (applied at the the charger magnet)
$ID_{bm}$ (minimum) inner diameter of the superconductor bulk magnet
LB location for magnetic flux density measurement (inside charger magnet, but outside of ferromagnetic shielding body)
$L_{bm}$ axial length of the superconductor bulk magnet
MC magnetic center (of the superconductor bulk magnet/ superconductor magnet apparatus)
$OD_{bm}$ (maximum) outer diameter of the superconductor bulk magnet
$S_{fb}$ average cross-sectional area of the ferromagnetic shielding body
$S_{bo}$ minimum cross-sectional area of the superconductor bore
$T_{bm}$ temperature of the superconductor bulk magnet
$T_{crit}$ critical temperature of the superconductor bulk magnet
z axis of rotational symmetry of the superconductor bulk magnet/axial direction

What is claimed is:

1. A superconductor magnet apparatus, comprising:
    a superconductor bulk magnet with a superconductor bore, wherein the superconductor bulk magnet has an axis (z) of rotational symmetry, and a maximum outer diameter $OD_{bm}$ in a plane perpendicular to the axis (z) of rotational symmetry, and the superconductor bore has a minimum cross-sectional area $S_{bo}$ in the plane perpendicular to the axis (z) of rotational symmetry,
    a cryostat with a room temperature bore, wherein the superconductor bulk magnet is arranged within the cryostat, and the room temperature bore is arranged within the superconductor bore, and
    a ferromagnetic shielding body with a shielding bore, wherein the superconductor bulk magnet is arranged within the shielding bore of the ferromagnetic shielding body and the ferromagnetic shielding body extends beyond the superconductor bulk magnet at each axial end with respect to the axis (z) of rotational symmetry by at least $OD_{bm}/3$,
    wherein for an average cross-sectional area $S_{fb}$ of the ferromagnetic shielding body, defined as the average of the cross-sectional areas of the ferromagnetic shielding body in all planes perpendicular to the axis (z) of rotational symmetry and intersecting the ferromagnetic shielding body, $S_{fb} \geq 2.5*S_{bo}$ applies, and
    wherein the ferromagnetic shielding body is arranged within the cryostat.

2. A superconductor magnet apparatus according to claim 1, wherein for a minimum inner diameter $ID_{bm}$ of the superconductor bulk magnet:
    $ID_{bm} \geq 20$ mm.

3. A superconductor magnet apparatus according to claim 1, wherein the superconductor bulk magnet has an axial length $L_{bm}$ along the axis (z) of rotational symmetry, with $L_{bm} \geq 2.5*ID_{bm}$, wherein $ID_{bm}$ is a minimum inner diameter of the superconductor bulk magnet.

4. A superconductor magnet apparatus according to claim 1, wherein the ferromagnetic shielding body comprises ferromagnetic end caps which reach radially inwards over at least a part of a radial thickness of the superconductor bulk magnet at each axial end of the ferromagnetic shielding body.

5. A superconductor magnet apparatus according to claim 1, wherein the cryostat comprises a controller device for controlling a temperature of the ferromagnetic shielding body.

6. A superconductor magnet apparatus according to claim 1, wherein the ferromagnetic shielding body has a substantially cylindrical wall shape having
a varying outer diameter and/or a varying inner diameter along the axis (z), and/or
a varying radial thickness as a function of an azimuthal angle position, and/or
boreholes.

7. A superconductor magnet apparatus according to claim 1, wherein the ferromagnetic shielding body has a cylindrical wall shape.

8. A superconductor magnet apparatus according to claim 6, wherein the varying radial thickness as a function of the azimuthal angle position comprises grooves along the axis (z).

9. A superconductor magnet apparatus according to claim 1, wherein the superconductor bulk magnet is in a charged state, and wherein a residual magnetic flux strength $B_{bo}$ is conserved by the superconductor bulk magnet at a magnetic center of the superconductor bulk magnet.

10. A superconductor magnet apparatus according to claim 9, wherein $B_{bo} \geq 3.5$ Tesla.

11. A superconductor magnet apparatus according to claim 9, configured such that a magnetic stray field outside the room temperature bore and outside the cryostat has a magnitude of 15 Gauss or less.

12. A superconductor magnet apparatus according to claim 11, wherein the ferromagnetic shielding body is configured such that a magnetic stray field outside the room temperature bore and outside the cryostat has a magnitude of 15 Gauss or less.

13. A superconductor magnet apparatus according to claim 9, wherein the ferromagnetic shielding body is at a magnetization of at least 70% of a maximum magnetization of the ferromagnetic shielding body.

14. A charging arrangement, comprising
an electrical charger magnet having a charger bore, and
a superconductor magnet apparatus according to claim 1, wherein the superconductor magnet apparatus is arranged at least partially within the charger bore.

15. A method for charging a superconductor bulk magnet within a superconductor magnet apparatus, said superconducting magnet apparatus comprising:
a superconductor bulk magnet with a superconductor bore, wherein the superconductor bulk magnet has an axis (z) of rotational symmetry, and a maximum outer diameter $OD_{bm}$ in a plane perpendicular to the axis (z) of rotational symmetry, and the superconductor bore has a minimum cross-sectional area $S_{bo}$ in the plane perpendicular to the axis (z) of rotational symmetry,
a cryostat with a room temperature bore, wherein the superconductor bulk magnet is arranged within the cryostat, and the room temperature bore is arranged within the superconductor bore, and
a ferromagnetic shielding body with a shielding bore,
wherein the superconductor bulk magnet is arranged within the shielding bore of the ferromagnetic shielding body and the ferromagnetic shielding body extends beyond the superconductor bulk magnet at each axial end with respect to the axis (z) of rotational symmetry by at least $OD_{bm}/3$,
wherein for an average cross-sectional area $S_{fb}$ of the ferromagnetic shielding body, defined as the average of the cross-sectional areas of the ferromagnetic shielding body in all planes perpendicular to the axis (z) of rotational symmetry and intersecting the ferromagnetic shielding body, $S_{fb} \geq 2.5 * S_{bo}$ applies, and
wherein the ferromagnetic shielding body is arranged within the cryostat, said method comprising:
a) placing the superconductor magnet apparatus at least partially within a charger bore of an electrical charger magnet,
b) applying at least one electrical current $I_0$ to the electrical charger magnet, to generate a magnetic flux density within the charger bore such that an applied magnetic flux density $B_{app}$ is present at a magnetic center of the superconductor bulk magnet, wherein a temperature $T_{bm}$ of the superconductor bulk magnet is above a critical temperature $T_{crit}$ of the superconductor bulk magnet;
c) lowering the temperature of the superconductor bulk magnet $T_{bm}$ below $T_{crit}$;
d) turning off the at least one electrical current $I_0$ at the electrical charger magnet, wherein $T_{bm} < T_{crit}$, such that a residual magnetic flux density $B_{bo}$ is conserved at the magnetic center; and
e) removing the superconductor magnet apparatus from the charger bore and keeping $T_{bm} < T_{crit}$.

16. A method according to claim 15, wherein in said step b), the at least one electric current $I_0$ is selected such that $B_{app} \geq 3.5$ Tesla.

17. A method according to claim 15, further comprising:
after said step e), maintaining the magnetic flux density on the axis (z) of rotational symmetry at a position of up to +5 mm and −5 mm with respect to the magnetic center within 100 ppm of $B_{bo}$
by selecting a shape of the superconductor bulk magnet and/or a shape of the ferromagnetic shielding body, and
by controlling a temperature of the ferromagnetic shielding body in the cryostat after said step e).

18. A method for performing a nuclear magnetic resonance (NMR) measurement of a sample, comprising:
charging a superconductor bulk magnet according to claim 15, and
after said step e), arranging the sample within the room temperature bore,
exposing the sample to the residual magnetic flux density $B_{bo}$ conserved by the superconductor bulk magnet at the magnetic center, and
performing the NMR measurement on the sample in the room temperature bore.

* * * * *